United States Patent
Beon et al.

(10) Patent No.: US 9,411,082 B2
(45) Date of Patent: Aug. 9, 2016

(54) POLARIZING PLATE, DISPLAY DEVICE INCLUDING THE POLARIZING PLATE, AND METHOD OF MANUFACTURING THE POLARIZING PLATE

(71) Applicant: Samsung Display Co., Ltd., Yongin (KR)

(72) Inventors: Beong-hun Beon, Hwaseong-si (KR); Seungbeom Park, Hwaseong-si (KR); Jihye Kim, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/306,787

(22) Filed: Jun. 17, 2014

(65) Prior Publication Data
US 2015/0168623 A1    Jun. 18, 2015

(30) Foreign Application Priority Data
Dec. 18, 2013 (KR) .................. 10-2013-0158432

(51) Int. Cl.

| | |
|---|---|
| H01L 29/08 | (2006.01) |
| H01L 35/24 | (2006.01) |
| H01L 51/00 | (2006.01) |
| G02B 5/30 | (2006.01) |
| G02B 1/10 | (2015.01) |
| G02B 1/04 | (2006.01) |
| G02B 5/02 | (2006.01) |
| H01L 27/32 | (2006.01) |
| H01L 51/52 | (2006.01) |

(52) U.S. Cl.
CPC .............. *G02B 5/3016* (2013.01); *G02B 1/04* (2013.01); *G02B 1/105* (2013.01); *G02B 5/0226* (2013.01); *G02B 5/3041* (2013.01); *G02B 5/3083* (2013.01); *H01L 27/3244* (2013.01); *H01L 51/5293* (2013.01)

(58) Field of Classification Search
None
See application file for complete search history.

(56) References Cited

U.S. PATENT DOCUMENTS

| | | | |
|---|---|---|---|
| 6,848,897 B2 | 2/2005 | Lazarev et al. | |
| 6,913,783 B2 | 7/2005 | Lazarev et al. | |
| 6,942,925 B1 | 9/2005 | Lazarev et al. | |
| 7,144,608 B2 * | 12/2006 | Paukshto | C09K 19/3452 252/299.62 |
| 7,315,338 B2 | 1/2008 | Yeh et al. | |
| 7,638,796 B2 | 12/2009 | Kwak et al. | |
| 8,338,823 B2 | 12/2012 | Kim et al. | |
| 2006/0113904 A1 | 6/2006 | Bae et al. | |
| 2006/0274220 A1 * | 12/2006 | Kim | G02F 1/13394 349/56 |
| 2008/0186432 A1 * | 8/2008 | Kye | G02B 5/3016 349/96 |
| 2010/0165598 A1 * | 7/2010 | Chen | G02B 6/0056 362/19 |
| 2010/0309415 A1 | 12/2010 | Rho et al. | |
| 2012/0050652 A1 | 3/2012 | Chang et al. | |
| 2013/0169896 A1 * | 7/2013 | Iwahashi | B41M 3/06 349/15 |
| 2013/0307759 A1 * | 11/2013 | Jang | G09G 3/30 345/76 |

FOREIGN PATENT DOCUMENTS

KR    10-2013-0062572    6/2013

* cited by examiner

*Primary Examiner* — Sonya D McCall Shepard
(74) *Attorney, Agent, or Firm* — H.C. Park & Associates, PLC

(57) ABSTRACT

A polarizing plate includes a base film and a polarizer. The polarizer includes a dichroic dye formed on the base film, oriented perpendicular to a plane of the base film, and having a discotic liquid crystal phase.

17 Claims, 5 Drawing Sheets

POLARIZING PLATE, DISPLAY DEVICE INCLUDING THE POLARIZING PLATE, AND METHOD OF MANUFACTURING THE POLARIZING PLATE

CROSS-REFERENCE TO RELATED APPLICATION

This application claims priority from and the benefit of Korean Patent Application No. 10-2013-0158432, filed on Dec. 18, 2013, which is hereby incorporated by reference for all purposes as if fully set forth herein.

BACKGROUND

The present disclosure herein relates to a polarizing plate, a display device including the polarizing plate, and a method of manufacturing the polarizing plate, and more particularly, to a polarizing plate, a display device including the polarizing plate, and a method of manufacturing the polarizing plate, capable of improving display properties.

Electronic apparatuses providing users with images, such as smart phones, digital, cameras, laptop computers, navigations, and smart televisions, include image display devices for displaying images. Generally, thin and light flat display panels are used in image display devices. Flat display panels include liquid crystal display panels, organic light emitting display panels, plasma display panels, electrophoresis display panels, etc.

On a display panel, a polarizing plate is formed. Recently, researches for improving display properties of display panels through polarizing plates.

It is to be understood that both the foregoing general description and the following detailed description are exemplary and explanatory and are intended to provide further explanation of the invention as claimed.

SUMMARY

The present disclosure provides a polarizing plate capable of effectively absorbing side light.

The present disclosure also provides a method of manufacturing a polarizing plate capable of effectively absorbing side light.

The present disclosure also provides a display device capable of effectively absorbing side light.

Additional features of the invention will be set forth in the description which follows, and in part will be apparent from the description, or may be learned by practice of the invention.

Embodiments of the inventive concept provide polarizing plates including a base film and a polarizer including a dichroic dye formed on the base film, perpendicularly oriented, and having a discotic liquid crystal phase.

In other embodiments of the inventive concept, methods of manufacturing a polarizing plate include preparing a base film and forming a polarizer on the base film. The forming of the polarizer may include coating the base film with a dichroic dye having a discotic liquid crystal phase, perpendicularly orienting the dichroic dye and curing the oriented dichroic dye.

In still other embodiments of the inventive concept, display devices include a display panel and a polarizing plate. The display panel includes a base board, a first electrode, a thin film transistor, an organic emission layer, and a second electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
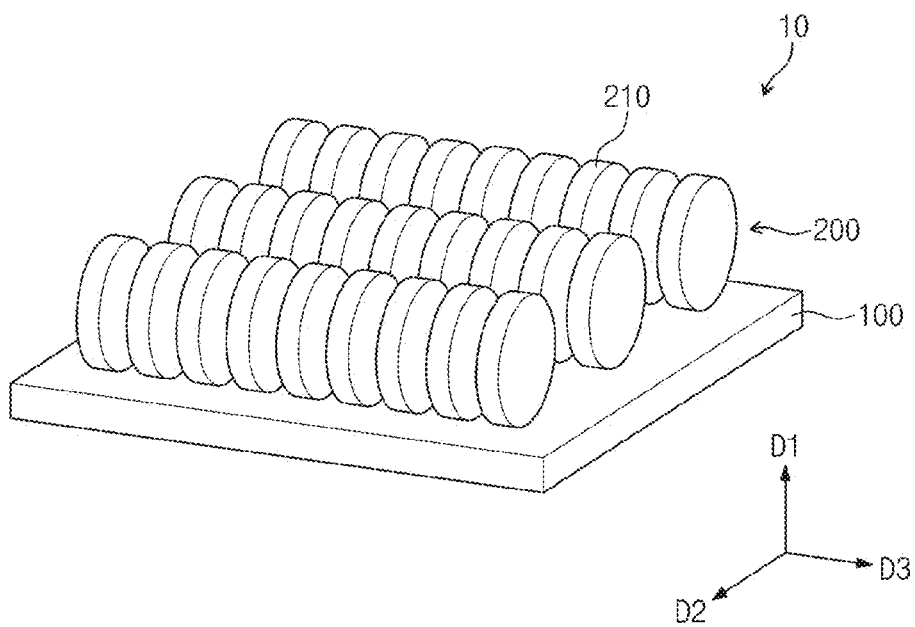
FIGS. 1 to 5 are schematic perspective views of examples of a polarizing plate according to an embodiment of the present invention.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

FIGS. 1 to 5 are schematic perspective views of examples of a polarizing plate 10 according to an embodiment of the present invention. Referring to FIG. 1, the polarizing plate 10 includes a base film 100 and a polarizer 200.

The polarizer 200 includes a dichroic dye 210 disposed on the base film 100, perpendicularly oriented with respect to a plane of the base film 100, and having a discotic liquid crystal phase. The polarizer 200 including the dichroic dye 210 has stable properties in an environment having a high temperature and high humidity, thereby having higher reliability than an iodine polarizer having polarizing properties differing according to a peripheral environment.

The polarizer 200 aligns light penetrating the base film 100. That is, the polarizer 200 may include the dichroic dye 210 having the perpendicularly oriented discotic liquid crystal phase, thereby aligning the light penetrating the base film 100 in a perpendicular direction. The dichroic dye 210 may have properties of absorbing different wavelengths, due to a molecular structure thereof. The dichroic dye 210 may have various visible light absorption wavelength ranges, thereby allowing the polarizer 200 to absorb light in a visible light wavelength range.

The polarizer 200 includes a first absorption axis, for example, a direction D1 of FIG. 1, which is formed in a thickness direction of the polarizer 200, for example, the direction D1 of FIG. 1, which is perpendicular to a plane of the base film 100. The first absorption axis formed in the thickness direction of the polarizer 200, thereby absorbing light oscillating in the thickness direction of the polarizer 200.

The polarizer 200 may further include a second absorption axis, for example, a direction D2 of FIG. 1, which is parallel to the plane of the base film 100 and perpendicular to the first absorption axis. The polarizer 200 includes the first absorption axis and the second absorption axis, thereby absorbing the light oscillating in the first and second absorption axes (directions D1 and D2).

The polarizer 200 includes a penetration axis, for example, a direction D3 of FIG. 1, parallel to the plane of the base film 100 and perpendicular to the second absorption axis. Accordingly, the polarizer 200 transmits light oscillating in the penetration axis and absorbs light oscillating in the first and second absorption axes.

The polarizer 200 may effectively absorb side light among light provided from a bottom of the base film 100, and may transmit front light. Accordingly, display properties of a display device including the polarizing plate 10 may be improved.

The polarizing plate 10 includes the base film 100. On a top of the base film 100, the polarizer 200 is formed. The base film 100 may be formed by depositing a plurality of films, according to some embodiments. The base film 100 may support the polarizing plate 10.

The base film 100 may include one of polyether sulfone (PES), cycloolefin polymer (COP), and one or more compounds selected from tri-acetyl cellulose (TAC), COP, cycloolefin copolymer (COC), polyethylene terephthalate (PET), polypropylene (PP), polycarbonate (PC), polysulfone (PSF), and polymethyl methacrylate (PMMA). However, other suitable compounds may be used.

The base film 100 may have a slow phase axis at an angle of from about 45° to about 135° with respect to the penetration axis of the polarizer 200. Through this, a phase difference may be given to the light penetrating the base film 100.

The base film 100 may be a λ/4 plate film. The λ/4 plate film may give a phase difference of λ/4 to the light penetrating the λ/4 plate film. The λ/4 plate film may give the phase difference through orientation, but other suitable methods may be used.

The λ/4 plate film may be formed by giving orientation to delay a phase by λ/4 in a particular wavelength range, through being coated with liquid crystal. The λ/4 plate film may include one of PES and COP, but other suitable materials may be used. PES or COP has excellent reliability at a high temperature and high humidity, and may be manufactured by a melting method.

Figure 2:
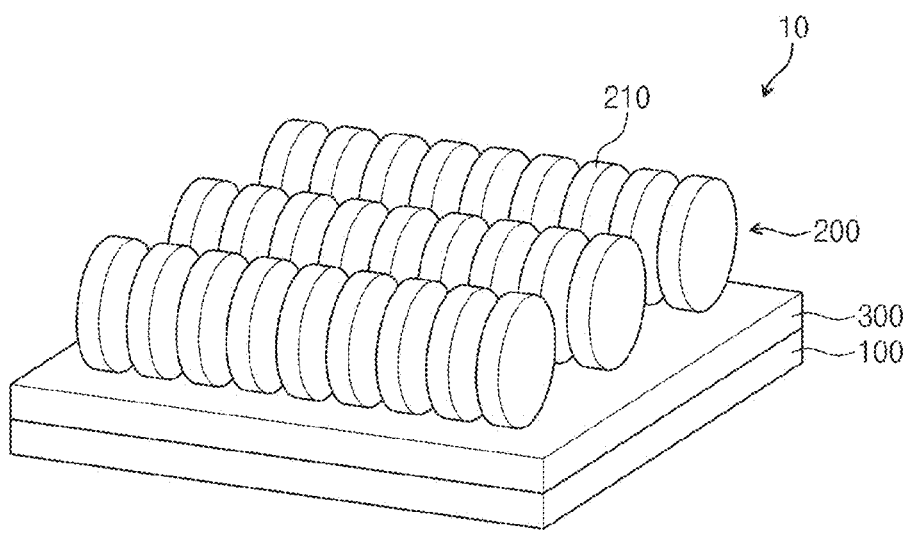

Referring to FIG. 2, the polarizing plate 10 may further include a supporting film 300 supporting the polarizer 200, between the base film 100 and the polarizer 200. The supporting film may be substantially optically transparent, and may use a cellulose polymer such as TAC. The base film 300 may be deposited as a plurality thereof if necessary.

Figure 3:
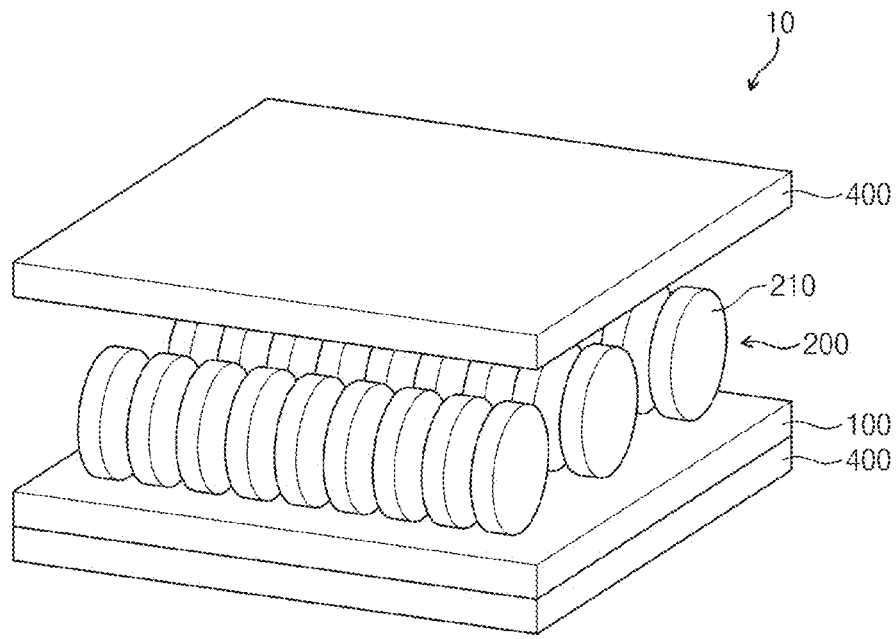

Referring to FIG. 3, the polarizing plate 10 may further include protection films 400 on the bottom of the base film 100 and/or on top of the polarizer 200. The protection film 400 may protect the base film 100 and the polarizer 200 from being polluted or damaged. The protection film 400 may be optically transparent and prevent birefringence.

The protection film 400 may be manufactured using one or more compounds selected from TAC, COP, COC, PET, PP, PC, PSF, and PMMA. The protection film 400 may be deposited as a plurality of films, according to some embodiments.

Figure 4:
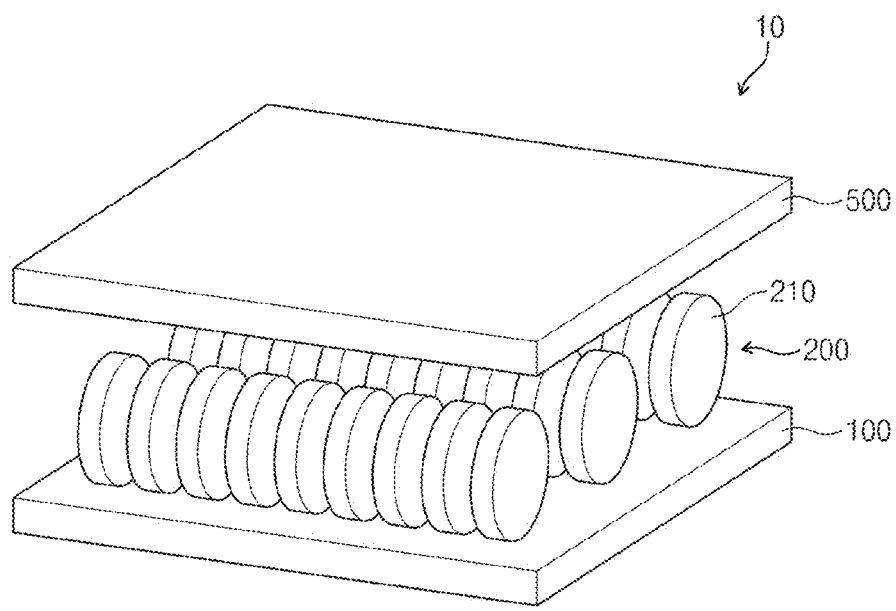

Referring to FIG. 4, the polarizing plate 10 may further include a surface treatment layer 500 on the top of the polarizer 200. The surface treatment layer 500 is formed on the top of the polarizer 200 and may improve surface properties of the polarizer 200.

The surface treatment layer 500 may be one of an antiglare layer including silica beads, a hard coating layer for preventing damage to a surface of the polarizer 200, and an antireflection layer. The base film 500 may be deposited as a plurality of films, according to some embodiments.

Figure 5:
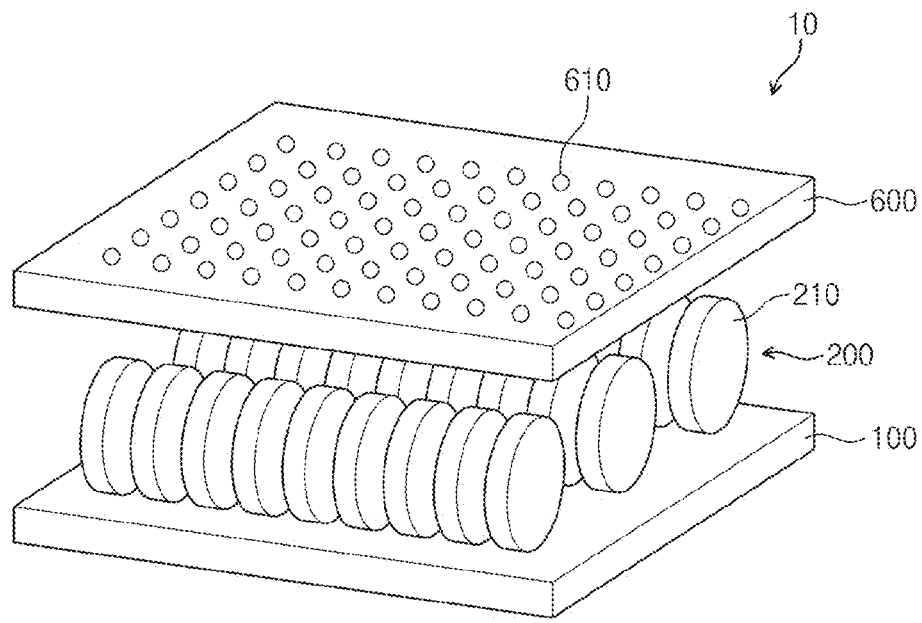

Referring to FIG. 5, the polarizing plate 10 may further include a scattering layer 600 on the top of the polarizer 200. The scattering layer 600 may include scattering bodies 510 for scattering light. The scattering layer 600 may improve visibility of front light by initially scattering light.

The scattering bodies 610 may include one of silicon oxide $SiO_2$ and polymer beads, but other suitable materials may be used. The scattering bodies 610 may be injected into the scattering layer 600 to be distributed and arranged. The base film 600 may be deposited as a plurality of films, according to some embodiments.

The polarizing plate 10 may further include an adhesive layer (not shown) on the bottom of the base film 100, to attach the polarizing plate 10 to the display device. Below the adhesive layer, an additional protection layer (not shown) may be further provided. The additional protection layer is detached during an attachment process, to expose the adhesive layer and protects the adhesive layer from being polluted while being transported or transferred.

According to the polarizing plate 10, side light may be effectively absorbed. That is, the polarizing plate 10 including the polarizer 200 may effectively absorb side light among light provided from the bottom of the base film 100, and may transmit front light. According thereto, display properties of a display device including the polarizing plate may be improved.

Figure 6:
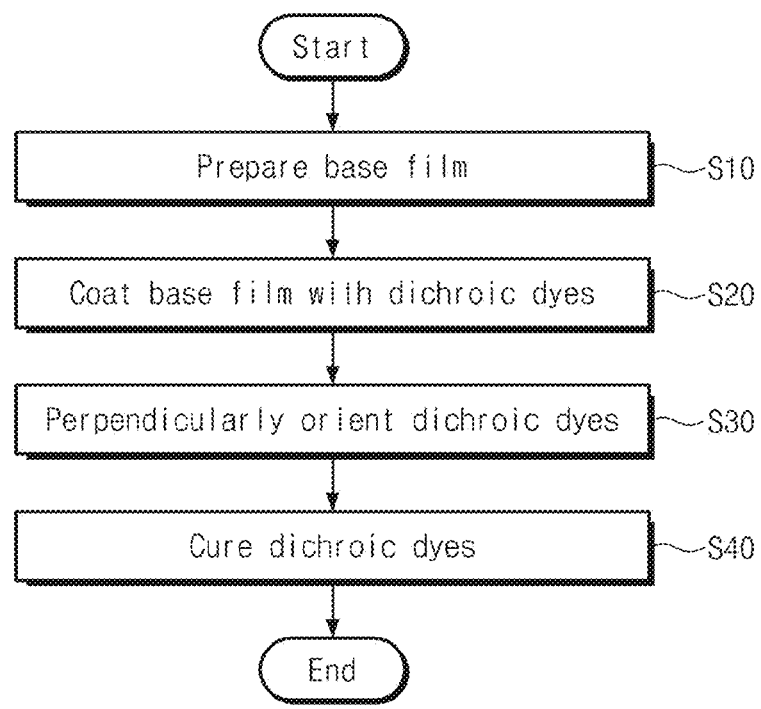
FIG. 6 is a schematic flowchart illustrating a method of manufacturing a polarizing plate according to an embodiment of the present invention.

FIG. 6 is a schematic flowchart illustrating the method of manufacturing the polarizing plate according to an embodiment of the present invention. Referring to FIG. 6, the method includes preparing a base film (S10) and forming a polarizer on the base film.

The forming of the polarizer includes coating the base film with a dichroic dye having a discotic liquid crystal phase (S20), perpendicularly orienting the dichroic dye (S30), and curing the oriented dichroic dye (S40). A method used in the coating the base film with the dichroic dye may be one of comma coating, fluid casting, using an air knife, gravure printing, reverse rolling, kiss rolling, spraying, and blading, but other suitable methods may be used.

A method used in the orienting (S30) may be one of rubbing and photoalignment, but other suitable methods may be used. The orienting (S30) includes forming a first absorption axis of the polarizer, the direction D1 of FIG. 1.

The orienting (S30) may include forming a second absorption axis, for example, in the direction D2 of FIG. 1. The polarizer includes the first absorption axis and the second absorption axis, thereby absorbing the light oscillating in two different directions.

The curing of the oriented dichroic dye (S40) may be performed using a hot-air drier, ultraviolet (UV) radiator, and infrared (IF) radiator. The oriented dichroic dye is cured, thereby improving durability of the polarizer.

According to the method according to various embodiments, a polarizing plate capable of effectively absorbing side light is provided. The polarizing plate manufactured using the method includes the polarizer, thereby effectively absorbing side light and transmitting front light. According thereto, display properties of a display device including the polarizing plate may be improved.

Hereinafter, a display device 30 according to an embodiment of the present invention will be described. A polarizing plate included in the display device 30 is substantially identical to the polarizing plate 10 described above. Accordingly, hereinafter, differences will be mainly described.

Figure 7:
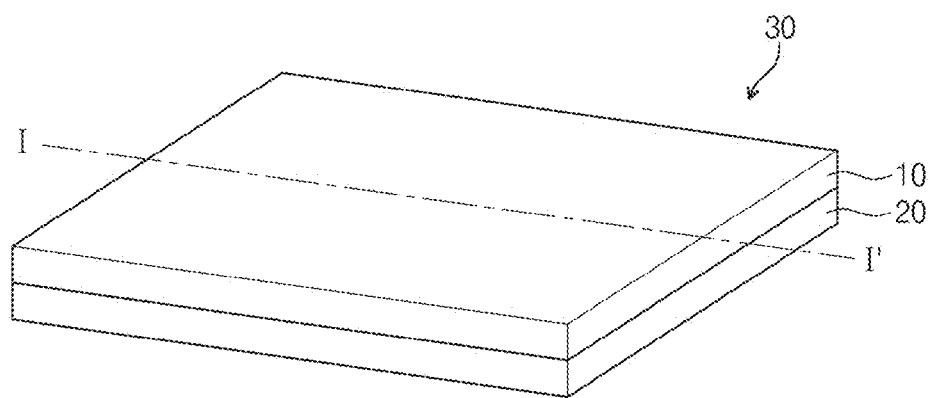
FIG. 7 is a schematic perspective view of a display device according to an embodiment of the present invention.
Figure 8:
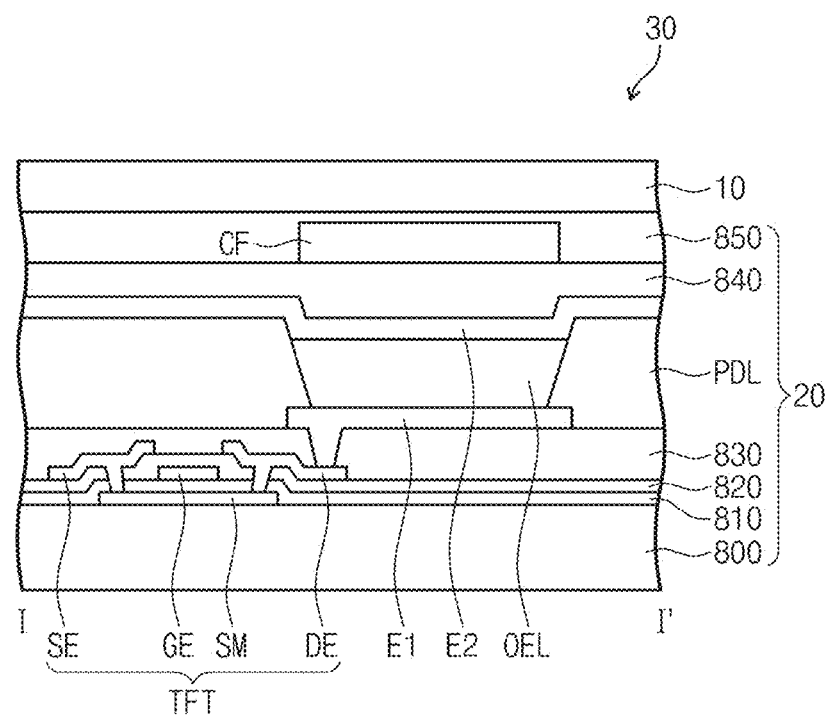
FIG. 8 is a cross-sectional view illustrating a part taken along a line I-I' of FIG. 7.

FIG. 7 is a schematic perspective view of the display device 30. FIG. 8 is a cross-sectional view illustrating a part taken along a line I-I' shown in FIG. 7. Referring to FIGS. 7 and 8, the display device 30 includes a display panel 20 and the polarizing plate 10.

The display panel 20 may include an organic light emitting display panel, a liquid crystal display (LCD) panel, a plasma display panel (PDP), an electrowetting display panel, or the like. However, hereinafter, the display panel 20 is described in terms of an organic light emitting display panel. The display panel 20 displays images. The display panel 20 includes a base board 800, a first insulating film 810, a second insulating film 820, a protection film 830, a thin film transistor TFT, a first electrode E1, an organic emission layer OEL, a second electrode E2, an encapsulation layer 840, and a color filter layer 850. The display panel 20 includes a plurality of pixel regions (not shown) designated as an emission region, and non-pixel regions (not shown) formed between the pixel regions and designated as a non-emission region.

The thin film transistor TFT is formed on the base board 800. The thin film transistor TFT applies an electric field to the first electrode E1 and the second electrode E2, thereby allowing the organic emission layer OEL to emit light.

The thin film transistor TFT includes a semiconductor layer SM, a gate electrode GE overlapped with the semiconductor layer SM, a source electrode SE, and a drain electrode DE. The second insulating film 820 covers the gate electrode GE. The source electrode SE and the drain electrode DE are formed on the second insulating film 820 to be separate from each other. The protection film 830 is formed to cover the source electrode SE and the drain electrode DE. The first electrodes E1 are formed on the protection film 830.

The first electrode E1 is formed on the protection film 830 and is electrically connected to the thin film transistor TFT. The organic emission layer OEL is formed on the first electrode E1. A pixel defining layer PDL, covering an interface between the organic emission layers OEL having a certain inclination angle, is formed on the protection film 830. The second electrode E2 is formed on the pixel defining layer PDL and the organic emission layer OEL.

The first electrode E1 may be an anode, and the second electrode E2 may be a cathode. The organic emission layer OEL may include a hole injection layer (HIL), a hole transporting layer (HTL), an emission layer (EML), an electron transporting layer (ETL), and/or an electron injection layer (EIL).

The encapsulation layer 840 may be formed on the second electrode E2. The encapsulation layer 840 may protect the first electrode E1, the organic emission layer OEL, and the second electrode E2.

The color filter layer 850 may be formed on the encapsulation layer 840. The color filter layer 850 may include a plurality of color filters CF and may include a black matrix (not shown) among the color filters CF. The color filters CF may include color pixels showing any one of red, green, blue, and white, respectively.

The polarizing plate 10 is formed on the display panel 20. The polarizing plate 10 includes the base film 100 and the polarizer 200.

The polarizer 200 includes the dichroic dye 210 formed on the base film 100. The polarizer 200 aligns a direction of light penetrating the base film 100. That is, the polarizer 200 may include the dichroic dye 210, thereby aligning the light penetrating the base film 100 in a perpendicular direction.

The dichroic dye 210 may have properties of absorbing mutually different wavelengths, due to a molecular structure thereof. The dichroic dye 210 may have various visible light absorption wavelength ranges, thereby allowing the polarizer 200 to absorb visible light in a wavelength range.

The polarizer 200 includes a first absorption axis, for example, the direction D1 of FIG. 1. The polarizer 200 may further include a second absorption axis, for example, the direction D2 of FIG. 1. The polarizer 200 includes the first absorption axis and the second absorption axis, thereby absorbing the light oscillating in two directions.

The polarizer 200 includes a penetration axis, for example, the direction D3 of FIG. 1. The polarizer 200 includes the penetration axis opposite to the base film 100 and perpendicular to the second absorption axis, thereby absorbing the lights oscillating in the first absorption axis direction and the second absorption axis direction, and transmitting light oscillating in a penetration axis direction.

The polarizer 200 may effectively absorb side light provided from a bottom of the base film 100, and may transmit front light. According thereto, display properties of the display device 30 including the polarizing plate 10 may be improved.

According to the polarizing plate 30, the side light may be effectively absorbed. That is, the polarizing plate 10 including the polarizer 200, included in the display device 30, may effectively absorb the side light among lights provided from the bottom of the base film 100 and may transmit the front light. According thereto, display properties of the display device 30 including the polarizing plate 10 may improve.

Hereinafter, an exemplary embodiment will be described in detail. Following embodiment is just an example for allowing the present disclosure to be understood and the scope of the inventive concept will not be limited thereto.

Experimental Example

A polarizer was manufactured by coating a λ/4 plate film manufactured using PES with a dichroic dye having a discotic liquid crystal phase, at a thickness of 7 μm, using a comma coating method. A compound of following Formula 1 was used as the dichroic dye.

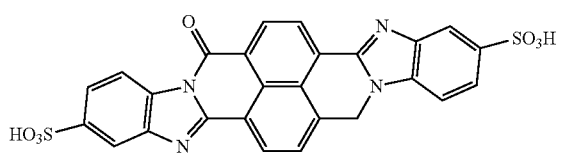

[Formula 1]

The dichroic dye was annealed and then perpendicularly oriented by rubbing, using a comb-patterned rubber roll having ribs and grooves. The oriented dichroic dye was cured by irradiating UV rays of 300 nm, thereby manufacturing a polarizing plate.

Comparative Example

A polarizing plate was manufactured identically to the embodiment except manufacturing a polarizer by dyeing oriented polyvinyl alcohol with iodine.

Experimental Example

Figure 9:
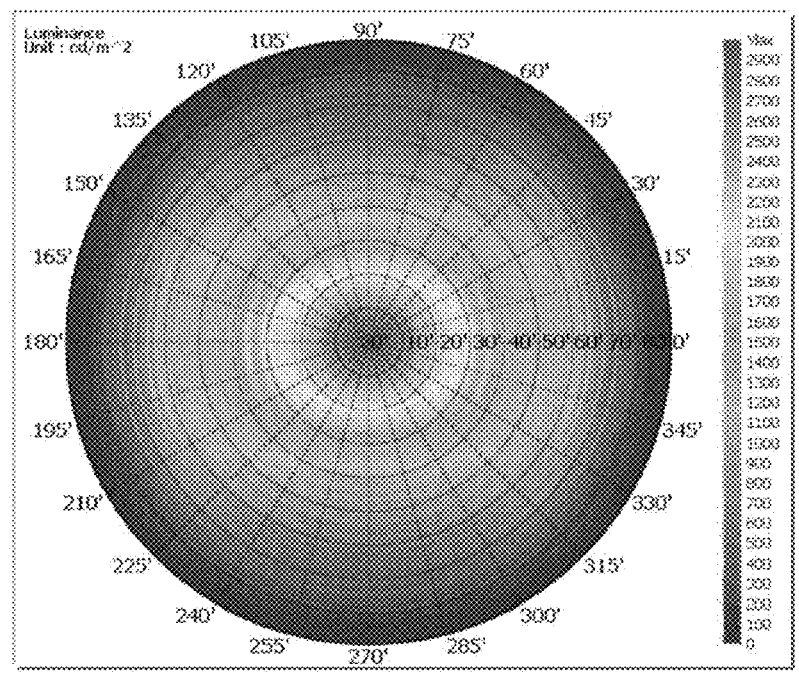
FIG. 9 is a graph of simulating and measuring light absorbed when using the polarizing plate according to an embodiment of the present invention.
Figure 10:
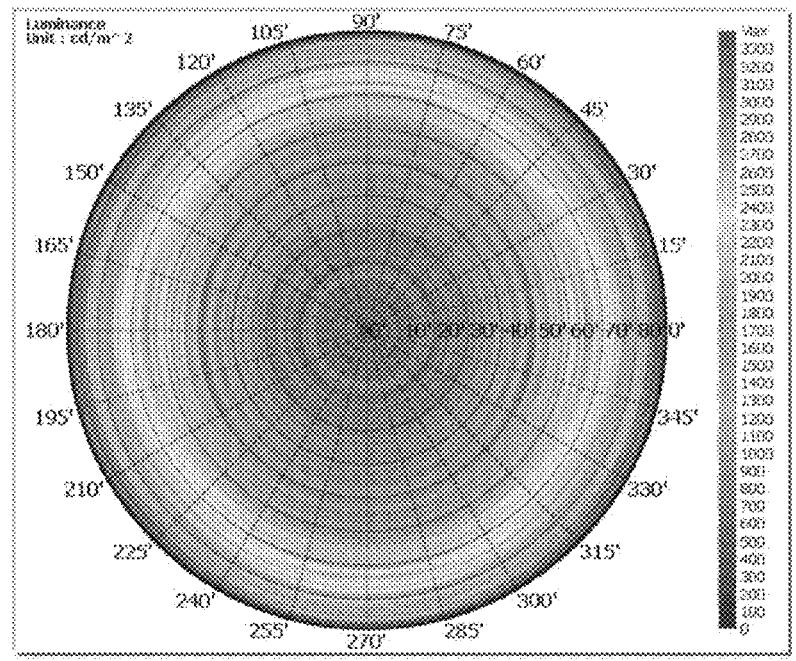
FIG. 10 is a graph of simulating and measuring light absorbed when using a polarizing plate according to a comparative example.

Related to polarizing plates of the embodiment and the comparative example, lights absorbed by the polarizing plates of the embodiment and the comparative example were simulated, thereby measuring the lights. FIGS. 9 and 10 are graphs illustrating results of measuring the lights.

FIG. 9 is a graph of simulating and measuring light absorbed when using the polarizing plate according to the experimental example, and FIG. 10 is a graph of simulating and measuring light absorbed when using the polarizing plate according to the comparative example.

In FIGS. 9 and 10, front light is shown as being closer to a center of a circle and side light is shown as being farther from the center of the circle.

Referring to FIGS. 9 and 10, it was checked that a part shown as dark color was more extensively distributed in FIG. 9 than FIG. 10. Through this, it was checked that the polarizing plate of the experimental example more effectively absorbed side light than the polarizing plate of the comparative example.

As described above, according to the one or more of the above embodiments of the present invention, there is provided a polarizing plate capable of effectively absorbing side light. There is provided a method of manufacturing a polarizing plate capable of effectively absorbing side light. There is provided a display device capable of effectively absorbing side light.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A polarizing plate comprising:
a base film; and
a polarizer comprising a dichroic dye disposed on the base film, oriented perpendicular to a plane of the base film, and having a discotic liquid crystal phase,
wherein the base film comprises a λ/4 plate film configured to give a phase difference of λ/4 to penetrating light.

2. The polarizing plate of claim 1, wherein the polarizer comprises a first absorption axis oriented perpendicular to the plane of the base film.

3. The polarizing plate of claim 2, wherein the polarizer further comprises a second absorption axis oriented perpendicular to the first absorption axis and parallel to the plane of the base film.

4. The polarizing plate of claim 3, wherein the polarizer comprises a penetration axis oriented perpendicular to the second absorption axis and parallel to the plane of the base film.

5. The polarizing plate of claim 4, wherein the base film comprises a slow phase axis oriented at an angle of from about 45° to about 135° with respect to the penetration axis of the polarizer.

6. The polarizing plate of claim 1, wherein the polarizer absorbs side light and transmits front light from light provided from a bottom of the base film.

7. The polarizing plate of claim 1, further comprising a surface treatment layer disposed on the polarizer.

8. The polarizing plate of claim 1, further comprising a supporting film supporting the polarizer and disposed between the λ/4 plate film and the polarizer.

9. The polarizing plate of claim 1, further comprising a protection film disposed on at least one of the base film and the polarizer.

10. The polarizing plate of claim 9, wherein the protection film comprises at least one compound selected from a group consisting of tri-acetyl cellulose (TAC), cycloolefin polymer (COP), cycloolefin copolymer (COC), polyethylene terephthalate (PET), polypropylene (PP), polycarbonate (PC), polysulfone (PSF), and polymethyl methacrylate (PMMA).

11. The polarizing plate of claim 1, further comprising a scattering layer disposed on the polarizer.

12. The polarizing plate of claim 11, wherein the scattering layer comprises one of silicon oxide beads and polymer beads.

13. A display device comprising:
a base board;
a thin film transistor disposed on the base board;
a first electrode disposed on the base board and electrically connected to the thin film transistor;
an organic emission layer disposed on the first electrode;
a second electrode disposed on the organic emission layer; and
a polarizing plate disposed on the second electrode,
wherein the polarizing plate comprises:
a base film; and
a polarizer comprising a dichroic dye disposed on the base film, oriented perpendicular to a plane of the base film, and having a discotic liquid crystal phase.

14. The display device of claim 13, wherein the polarizer comprises a first absorption axis oriented perpendicular the plane of the base film.

15. The display device of claim 14, wherein the polarizer further comprises a second absorption axis oriented perpendicular to the first absorption axis.

16. The display device of claim 15, wherein the polarizer comprises a penetration axis oriented perpendicular to the second absorption axis and extending parallel to the plane of the base film.

17. The display device of claim 16, wherein the base film comprises a slow phase axis oriented at an angle of from about 45° to about 135° with respect to the penetration axis of the polarizer.

* * * * *